US008675801B2

(12) United States Patent  
Yen

(10) Patent No.: US 8,675,801 B2  
(45) Date of Patent: *Mar. 18, 2014

(54) CLOCK GENERATING CIRCUIT, TRANSCEIVER AND RELATED METHOD

(71) Applicant: Chin-Hsien Yen, Keelung (TW)

(72) Inventor: Chin-Hsien Yen, Keelung (TW)

(73) Assignees: Silicon Motion Inc., Tianan Digital City, Futian, Shenzhen, Guangdong (CN); Silicon Motion Inc., Jhubei, Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/647,397

(22) Filed: Oct. 9, 2012

(65) Prior Publication Data

US 2013/0039385 A1 Feb. 14, 2013

Related U.S. Application Data

(63) Continuation of application No. 12/649,348, filed on Dec. 30, 2009, now Pat. No. 8,311,177.

(30) Foreign Application Priority Data

Jul. 23, 2009 (TW) .............................. 98124855 A

(51) Int. Cl.
*H03D 3/24* (2006.01)

(52) U.S. Cl.
USPC ........................... 375/376; 375/219; 375/259

(58) Field of Classification Search
USPC ................. 375/373, 371, 374, 375, 222, 219, 375/259–260, 376; 327/147–148, 156–157
See application file for complete search history.

(56) References Cited

U.S. PATENT DOCUMENTS

| | | | |
|---|---|---|---|
| 7,042,258 B2 | 5/2006 | Booth | |
| 7,102,448 B2 | 9/2006 | Chou | |
| 7,133,648 B1 | 11/2006 | Robinson | |
| 2004/0223574 A1 | 11/2004 | Kuo | |
| 2006/0245531 A1 | 11/2006 | Leonowich | |
| 2007/0025490 A1 | 2/2007 | Azadet | |
| 2007/0285176 A1 | 12/2007 | North | |
| 2008/0094145 A1 | 4/2008 | Kuan | |
| 2009/0237128 A1 | 9/2009 | Qiao | |
| 2010/0002822 A1* | 1/2010 | Arima et al. ................... | 375/371 |

FOREIGN PATENT DOCUMENTS

CN 1812268 A 8/2006

* cited by examiner

*Primary Examiner* — Jean B Corrielus  
(74) *Attorney, Agent, or Firm* — Winston Hsu; Scott Margo

(57) ABSTRACT

A clock generating circuit includes: a phase detector for detecting a phase difference between an input clock and a reference clock to generate a control signal corresponding to the phase difference; a controllable oscillator for generating a plurality of output clocks according to the control signal, wherein the plurality of output clocks correspond to an oscillating frequency and correspond to a plurality of different phases respectively; a phase selector for selecting an output clock as a feedback clock from the plurality of output clocks according to a phase select signal; a feedback circuit for generating the input clock according to the feedback clock; and a phase difference comparator for comparing the plurality of phases corresponding to the plurality of output clocks respectively with a data phase of a data signal to generate a compared result, and generating the phase select signal according to the compared result.

13 Claims, 6 Drawing Sheets

CLOCK GENERATING CIRCUIT, TRANSCEIVER AND RELATED METHOD

CROSS REFERENCE TO RELATED APPLICATIONS

This application is a Continuation application of U.S. patent application Ser. No. 12/649,348 (now U.S. Pat. No. 8,311,177), which was filed on Dec. 30, 2009 and is incorporated herein by reference.

BACKGROUND OF THE INVENTION

1. Field of the Invention

The present invention relates to a clock data recovery circuit and a method thereof, and more particularly to a clock data recovery circuit utilizing a phase selector for selecting an output clock as a feedback clock from a plurality of output clocks to reduce the cost of the clock data recovery circuit, and a method thereof.

2. Description of the Prior Art

Clock data recovery circuit can be utilized for receiving a digital data and generating a clock signal according to the digital data, wherein the clock signal generated by the clock data recovery circuit is synchronized with the digital data. Thus, in a communication system, the clock data recovery circuit is not only being utilized for recovering the clock signal carried by the digital data, but also being utilized for repairing the digital data. For example, the clock data recovery circuit can be utilized to reduce the digital data's noise, and to adjust the timing of the rising edge and the falling edge of the digital data. In addition, the clock data recovery circuit generates the clock signal according to a reference clock signal and the digital data, wherein the frequency of the reference clock signal is slower than the frequency of the clock signal.

Conventionally, the clock data recovery circuit is configured as a feedback loop. Firstly, the clock data recovery circuit generates a plurality of clock signals with different phases according to the reference clock signal. Then, the clock signals are inputted to a phase rotator. The phase rotator adjusts a specific phase upon all of the phases of the plurality of clock signals to generate a plurality of adjusted phases. Then, the digital data is compared with the plurality of adjusted phases to generate a plurality of compared results respectively. Then, the phase rotator further adjusts the specific phase according to the plurality of compared results in order to match the plurality of compared results with a predetermined combination. By doing so recursively, the clock signal generated by the phase rotator may synchronize with the clock signal of the digital data when the plurality of compared results are matched to the predetermined combination.

However, the cost of the above-mentioned clock data recovery circuit is expensive since the area occupied by the phase rotator is relatively large and the operation of the phase rotator is complicated. For example, if four different combinations of phases are required in the conventional clock data recovery circuit, wherein each combination is comprised of eight phases, then the phase rotator may comprise at least four 8-to-1 multiplexers, which may occupy quite a large area in the whole clock data recovery circuit. Therefore, providing a low cost clock data recovery circuit and therefore reducing the cost of a transceiver is a significant concern in the mixed signal field.

SUMMARY OF THE INVENTION

Therefore, one of the objectives of the present invention is to provide a clock data recovery circuit utilizing a phase selector for selecting an output clock as a feedback clock from a plurality of output clocks to reduce the cost of the clock data recovery circuit, and a method thereof.

According to a first embodiment of the present invention, a clock generating circuit is disclosed. The clock generating circuit comprises a phase detector, a controllable oscillator, a phase selector, a feedback circuit, and a phase difference comparator. The phase detector is used for detecting a phase difference between an input clock and a reference clock to generate a control signal corresponding to the phase difference. The controllable oscillator is used for generating a plurality of output clocks according to the control signal, wherein the plurality of output clocks correspond to an oscillating frequency and correspond to a plurality of different phases respectively. The phase selector is coupled to the controllable oscillator for selecting an output clock as a feedback clock from the plurality of output clocks according to a phase select signal. The feedback circuit is coupled to the phase detector and the phase selector for generating the input clock according to the feedback clock. The phase difference comparator is coupled to the controllable oscillator and the phase selector for comparing the plurality of phases corresponding to the plurality of output clocks respectively with a data phase of a data signal to generate a compared result, and generating the phase select signal according to the compared result.

According to a second embodiment of the present invention, a clock generating method is disclosed. The clock generating method comprises: detecting a phase difference between an input clock and a reference clock to generate a control signal corresponding to the phase difference; generating a plurality of output clocks according to the control signal, wherein the plurality of output clocks correspond to an oscillating frequency and correspond to a plurality of different phases respectively; selecting an output clock as a feedback clock from the plurality of output clocks according to a phase select signal; generating the input clock according to the feedback clock; and comparing the plurality of phases corresponding to the plurality of output clocks respectively with a data phase of a data signal to generate a compared result, and generating the phase select signal according to the compared result.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
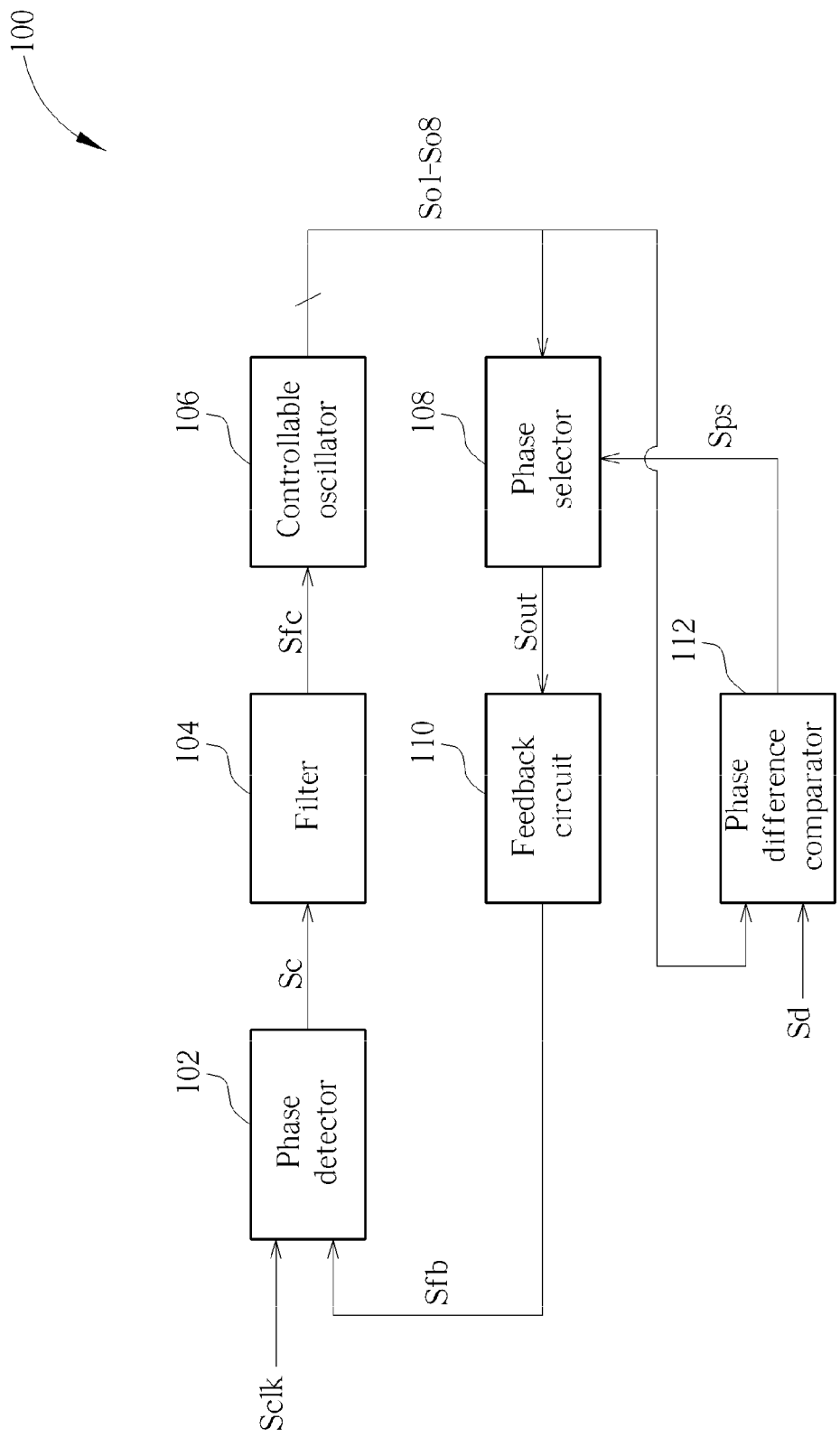
FIG. 1 is a diagram illustrating a clock generating circuit according to an embodiment of the present invention.

Please refer to FIG. 1. FIG. 1 is a diagram illustrating a clock generating circuit according to an embodiment of the present invention. To clearly illustrate the features of the clock generating circuit, the clock generating circuit is described by utilizing a clock data recovery circuit 100, wherein the clock data recovery circuit 100 is employed to recover a data clock in a data signal Sd, and this is not a limitation of the present invention. The clock data recovery circuit 100 comprises a phase detector 102, a filter 104, a controllable oscillator 106, a phase selector 108, a feedback circuit 110, and a phase difference comparator 112. The phase detector 102 is utilized for detecting a phase difference between an input clock Sfb and a reference clock Sclk to generate a control signal Sc corresponding to the phase difference. The filter 104 is coupled to the phase detector 102 for filtering the control signal Sc to generate a filtered control signal Sfc. The controllable oscillator 106 is coupled to the filter 104 for generating a plurality of output clocks So1-So8 according to the filtered control signal Sfc, wherein the plurality of output clocks So1-So8 correspond to an oscillating frequency fo (e.g., 10 MHz) and correspond to a plurality of different phases p1-p8 respectively. The phase selector 108 is coupled to the controllable oscillator 106 for selecting an output clock as a feedback clock Sout from the plurality of output clocks So1-So8 according to a phase select signal Sps. The feedback circuit 110 is coupled to the phase detector 102 and the phase selector 108 for generating the input clock Sfb according to the feedback clock Sout.

Furthermore, the phase difference comparator 112 is coupled to the controllable oscillator 106 and the phase selector 108 for comparing the plurality of phases p1-p8 corresponding to the plurality of output clocks So1-So8 respectively with a data phase in the data signal Sd to generate a compared result, and generating the phase select signal Sps according to the compared result. More specifically, the phase difference comparator 112 compares the plurality of phases p1-p8 with the phase of the clock signal carried by the data signal Sd to generate the compared result. Please note that, although this embodiment is illustrated by eight output clocks So1-So8 and the corresponding eight phases p1-p8, the number of output clocks and phases is not a limitation of the present invention. In addition, although the feedback circuit 110 is implemented by a frequency divider in this embodiment, this is not the limitation of the present invention either.

Figure 2:
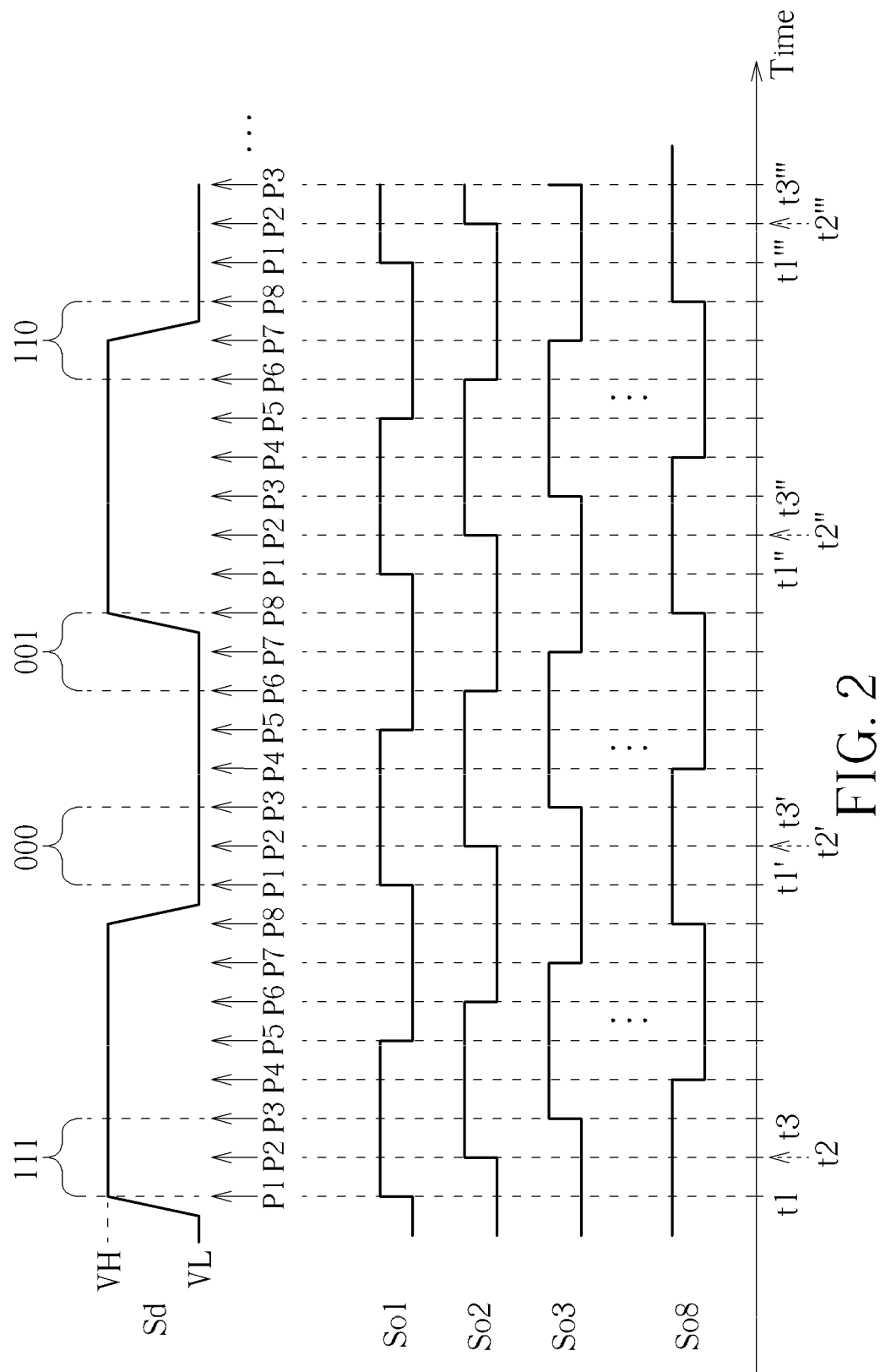
FIG. 2 is a timing diagram illustrating a data signal and eight phases of eight output clocks in the clock data recovery circuit shown in FIG. 1.
Figure 3:
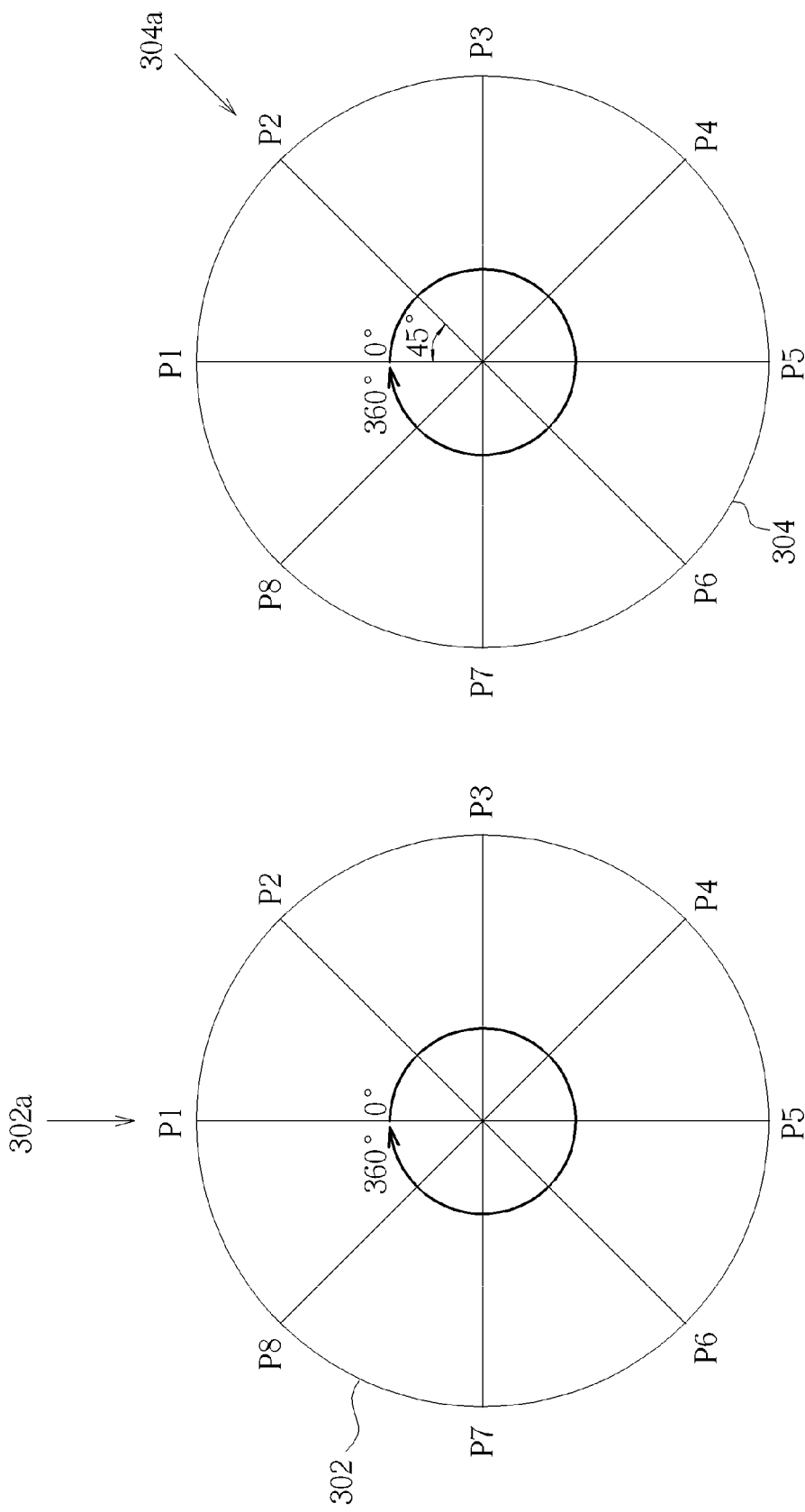
FIG. 3 is a phase diagram illustrating the eight phases corresponding to the eight output clocks.

According to this embodiment, a feedback loop configured by the phase detector 102, the filter 104, the controllable oscillator 106, the phase selector 108, and the frequency divider 110 generates a combination of output clocks So1-So8 according to a predetermined condition when the clock data recovery circuit 100 is activated. Please note that, the predetermined condition of this embodiment is to set the phase selector 108 to select the first output clock So1 from the output clocks So1-So8 as the feedback clock Sout, but this is not a limitation of the present invention. Then, the controllable oscillator 106 generates the eight output clocks So1-So8 having the eight phases p1-p8 respectively when the clock data recovery circuit 100 receives the data signal Sd. Please note that, the eight phases p1-p8 may have the same phase difference with each other. Then, the phase difference comparator 112 compares the data phase of the data signal Sd with the eight phases p1-p8 to generate the compared result as shown in FIG. 2. FIG. 2 is a timing diagram illustrating the data signal Sd and the eight phases p1-p8 of the output clocks So1-So8 in the clock data recovery circuit 100 shown in FIG. 1. Please note that, to clearly illustrate the features of the clock data recovery circuit 100, the above-mentioned eight phases p1-p8 are further illustrated by the phase diagram in FIG. 3. FIG. 3 is the phase diagram illustrating the eight phases p1-p8 corresponding to the output clocks So1-So8. There are two phase diagrams 302, 304 representing the eight phases p1-p8 in FIG. 3, wherein the arrow 302a of the phase diagram 302 pointing to the phase p1 means that the phase selector 108 selects the first output clock So1 as the feedback clock Sout from the output clocks So1-So8, and the arrow 304a of the phase diagram 304 pointing to the phase p2 means that the phase selector 108 selects the second output clock So2 as the feedback clock Sout from the output clocks So1-So8, and so on. Therefore, when the clock data recovery circuit 100 selects the first output clock So1 as the feedback clock Sout from the output clocks So1-So8, the controllable oscillator 106 generates the eight phases p1-p8 corresponding to the output clocks So1-So8 at times t1, t2, t3, . . . , t8 respectively as shown in FIG. 2. In addition, the phases p1-p3 trigger the phase difference comparator 112 at times t1, t2, t3 to detect the voltage level of the data signal Sd respectively, and then to generate a detected result respectively. In this embodiment, the detected result is 1 when the phase difference comparator 112 detects that the data signal Sd is high voltage level VH. On the other hand, the detected result is 0 when the phase difference comparator 112 detects that the data signal Sd is low voltage level VL. Accordingly, the phase difference comparator 112 outputs 111 at times t1, t2, t3, and the phase difference comparator 112 outputs 000 at times t1', t2', t3' as shown in FIG. 2. Please note that, the setting condition of the detected result is not a limitation of the present invention.

When the detected result generated by the phase difference comparator 112 is "111000", in which the detected result "111000" correspond to times t1, t2, t3, t1', t2', t3', meaning that the oscillating frequency fo is slower than the data frequency of the data signal Sd. Then the phase difference comparator 112 outputs the phase select signal Sps to select another output clock, such as the second output clock So2, having a phase lagging the phase of the first output clock So1 as the feedback clock Sout from the output clocks So1-So8. According to FIG. 2, by setting the first phase p1 of the first output clock So1 as the reference phase, i.e., the first phase p1 is 0 degree, then the second phase p2 of the second output clock So2 (i.e. the lagging output clock) is 45 degree. In this embodiment, the second phase p2 of the second output clock So2 is therefore larger than the first phase p1 of the first output clock So1. When the phase difference comparator 112 selects the second output clock So2 as the feedback clock Sout, the phase detector 102 obtains that the phase difference between the input clock Sfb and the reference clock Sclk is larger than the previous one, i.e., this phase difference is larger than the phase difference generated by selecting the first output clock So1 as the feedback clock Sout. Then, the controllable oscillator 106 generates the next combination of output clocks So1-So8 having the faster oscillating frequency. For example, if the oscillating frequency of the controllable oscillator 106 corresponding to selecting the first output clock So1 is 10

MHz, then the oscillating frequency of the controllable oscillator 106 corresponding to selecting the second output clock So2 may be 10.1 MHz. Similarly, the eight phases p1-p8 of the output clocks So1-So8 are then utilized to trigger the phase difference comparator 112 to detect the voltage level of the data signal Sd. According to the embodiment of the present invention, the phase difference comparator 112 outputs "001110" at times t1'', t2'', t3'', t1''', t2''', t3''' as shown in FIG. 2. When the detected result generated by the phase difference comparator 112 is "001110", the output clocks So1-So8 generated by the controllable oscillator 106 are synchronized with the data signal Sd. Then, the phase difference comparator 112 keeps the phase select signal Sps intact such that the controllable oscillator 106 continues to generate the output clocks So1-So8 synchronizing with the data signal Sd. Please note that, the objective of generating the detected result by the phase difference comparator 112 is to determine if the output clocks So1-So8 are synchronized with the data signal Sd, and the present invention is not limited in utilizing "001110" to determine if the output clocks So1-So8 are synchronized with the data signal Sd. According to FIG. 2, the output clocks So1-So8 can also be determined as synchronizing with the data signal Sd when the detected result is "011100". Moreover, the output clocks So1-So8 can also be determined as synchronizing with the data signal Sd when the detected result is either "100011" or "110001".

On the other hand, when the detected result generated by the phase difference comparator 112 is "000111", the oscillating frequency fo is faster than the data frequency of the data signal Sd. Then the phase difference comparator 112 outputs the phase select signal Sps to select another output clock having a phase leading the phase of the first output clock So1 as the feedback clock Sout from the output clocks So1-So8. Please note that, after reading the disclosure corresponding to the detected result of "111000", those skilled in this art are readily able to understand the similar operation of the clock data recovery circuit 100 corresponding to the detected result of "000111", thus the detailed description is omitted here for brevity.

When the output clocks So1-So8 are synchronized with the data signal Sd, one output clock of the output clocks So1-So8 can be employed for reading the value of the data signal Sd. For the example of the data signal Sd as shown in FIG. 2, when the output clocks So1-So8 are synchronized with the data signal Sd, the fifth output clock So5 (e.g., the rising edge of the fifth output clock So5) of the output clocks So1-So8 is substantially located at the middle point of the data signal Sd. Then, the clock data recovery circuit 100 utilizes the fifth output clock So5 to read the value of the data signal Sd.

On the other hand, when the phase difference comparator 112 of the clock data recovery circuit 100 detects that the output clocks So1-So8 do not synchronize with the data signal Sd, the phase difference comparator 112 outputs the phase select signal Sps to adjust the phase selector 108 right away such that the controllable oscillator 106 outputs the output clocks So1-So8 correspondingly, therefore the FIG. 1's clock data recovery circuit 100 is capable of fast-locking the data signal Sd. However, under practical conditions, the jitters of the output clocks So1-So8 frequently cause misjudgment of the phase difference comparator 112 such that the phase difference comparator 112 generates an erroneous detected result. Therefore, in another embodiment of the present invention, the phase difference comparator 112 is implemented as a phase accumulating circuit in order to more accurately determine the phase relations between the output clocks So1-So8 and the data signal Sd. In this embodiment, the phase difference comparator 112 generates a plurality of the compared results at different times respectively, and generates the phase select signal Sps according to the plurality of compared results. More specifically, when the number of times that the oscillating frequency fo slower than the data frequency of the data signal Sd is larger than the number of times that the oscillating frequency fo faster than the data frequency of the data signal Sd in the plurality of the compared results, the phase selector 108 selects another output clock having the phase lagging the phase of the first output clock So1 as the feedback clock Sout from the output clocks So1-So8, and when the number of times that the oscillating frequency fo slower than the data frequency of the data signal Sd is less than the number of times that the oscillating frequency fo faster than the data frequency of the data signal Sd in the plurality of the compared results, the phase selector 108 selects another output clock having the phase leading the phase of the first output clock So1 as the feedback clock Sout from the output clocks So1-So8. Briefly, the phase difference comparator 112 accumulates the phase differences between the output clocks So1-So8 and the data signal Sd, and then selects one output clock from the output clocks So1-So8 as the feedback clock Sout to adjust the oscillating frequency fo of the controllable oscillator 106 such that the output clocks So1-So8 are synchronized with the data signal Sd. Meanwhile, the oscillating frequency fo is substantially equal to the data frequency of the data signal Sd.

Figure 4:
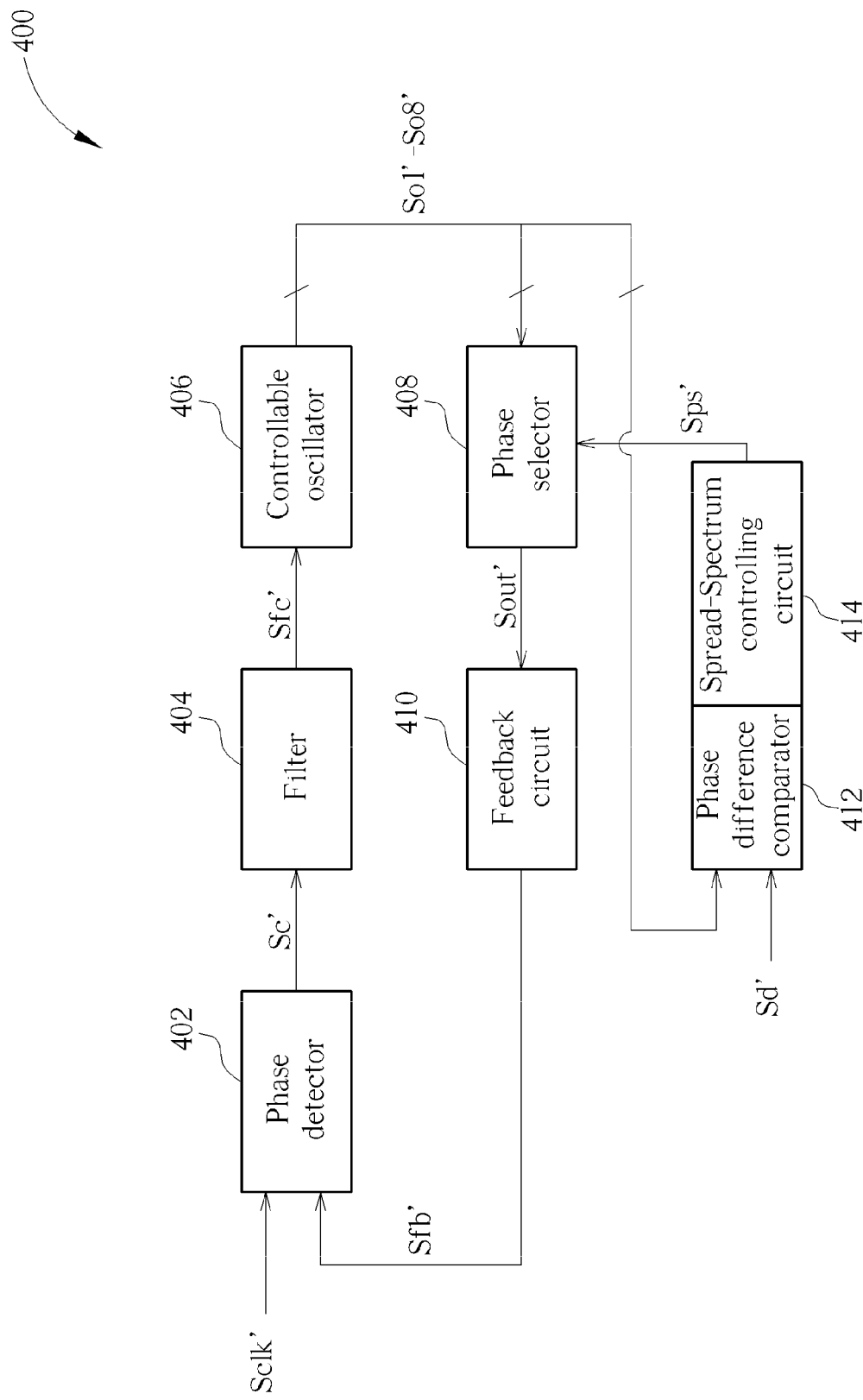
FIG. 4 is a diagram illustrating a clock data recovery circuit according to a second embodiment of the present invention.

Please refer to FIG. 4. FIG. 4 is a diagram illustrating a clock data recovery circuit 400 according to a second embodiment of the present invention, wherein the clock data recovery circuit 400 is employed to recover a data clock in a data signal Sd', and this is not a limitation of the present invention. The clock data recovery circuit 400 comprises a phase detector 402, a filter 404, a controllable oscillator 406, a phase selector 408, a feedback circuit 410, a phase difference comparator 412, and a spread-spectrum controlling circuit 414. The phase detector 402 is utilized for detecting a phase difference between an input clock Sfb' and a reference clock Sclk' to generate a control signal Sc' corresponding to the phase difference. The filter 404 is coupled to the phase detector 402 for filtering the control signal Sc' to generate a filtered control signal Sfc'. The controllable oscillator 406 is coupled to the filter 404 for generating a plurality of output clocks So1'-So8' according to the filtered control signal Sfc', wherein the plurality of output clocks So1'-So8' correspond to an oscillating frequency fo' and correspond to a plurality of different phases p1'-p8' respectively, wherein the oscillating frequency fo' is within a predetermined frequency range (e.g., between the frequencies f1 and f2). The phase selector 408 is coupled to the controllable oscillator 406 for selecting an output clock as a feedback clock Sout' from the plurality of output clocks So1'-So8' according to a phase select signal Sps'. The feedback circuit 410 is coupled to the phase detector 402 and the phase selector 408 for generating the input clock Sfb' according to the feedback clock Sout'.

Furthermore, the phase difference comparator 412 is coupled to the controllable oscillator 406 for comparing the plurality of phases p1'-p8' corresponding to the plurality of output clocks So1'-So8' respectively with a data phase in the data signal Sd' to generate a compared result. The spread-spectrum controlling circuit 414 is coupled between the phase difference comparator 412 and the phase selector 408 for adjusting the compared result, which is generated by the phase difference comparator 412, inputting to the phase selector 408 such that the frequencies of the output clocks So1'-So8' are spectrum-spread within the predetermined frequency range that is regulated in the electro-magnetic interference (EMI) standard of a circuit system as shown in FIG. 5.

Figure 5:
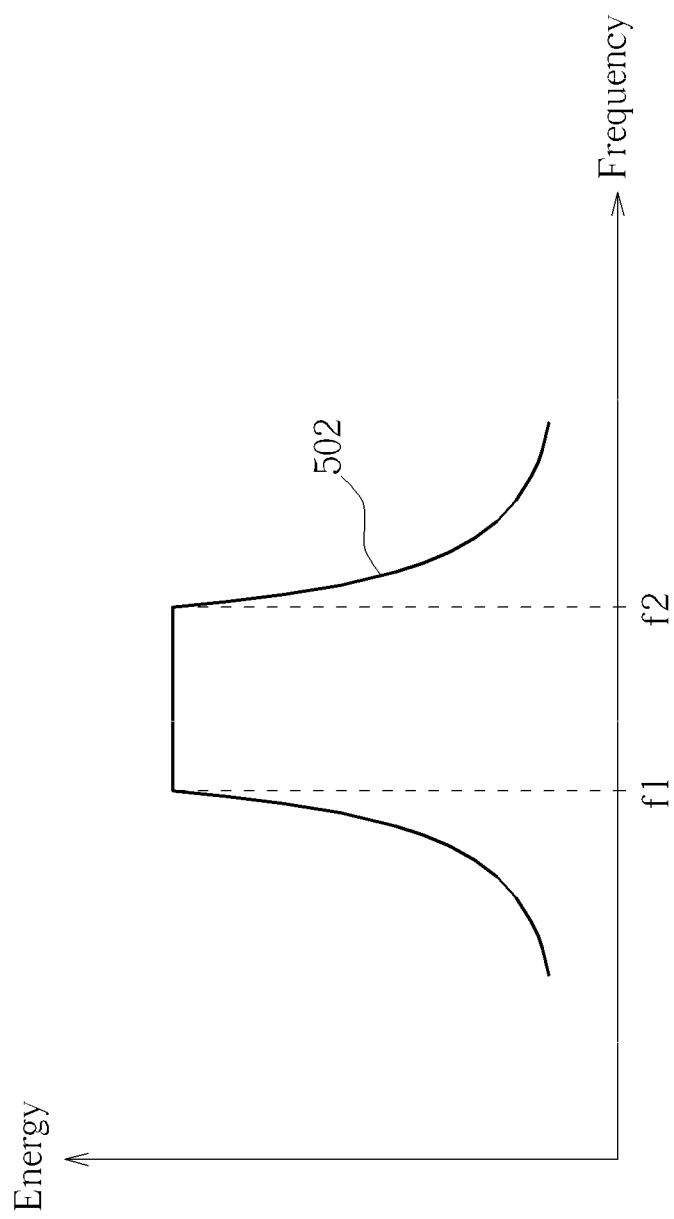
FIG. 5 is a diagram illustrating a frequency domain of the output clocks in the clock data recovery circuit shown in FIG. 4.

FIG. 5 is a diagram illustrating the frequency domain of the output clocks So1'-So8' in the clock data recovery circuit 400, wherein the curve 502 represents the frequency distribution of the output clocks So1'-So8', and the X axis and Y axis represent the frequency and energy respectively. Please note that, those skilled in this art are readily able to understand that the present invention is not limited to the eight output clocks So1'-So8' and the corresponding eight phases p1'-p8'. In addition, the feedback circuit 410 is implemented by a frequency divider in this embodiment, and this is also not a limitation of the present invention.

Comparing to the FIG. 1's clock data recovery circuit 100, the clock data recovery circuit 400 further comprises the spread-spectrum controlling circuit 414, therefore the following description related to the clock data recovery circuit 400 is mainly focused on the operation of the spread-spectrum controlling circuit 414 and the total effect of the clock data recovery circuit 400 including the spread-spectrum controlling circuit 414. Please refer to the disclosed features related to the clock data recovery circuit 100 shown in FIG. 1, the spread-spectrum controlling circuit 414 performs an adjusting operation upon the compared result to generate an adjusted compared result after the compared result is generated by the phase difference comparator 412 of the clock data recovery circuit 400. Then, the spread-spectrum controlling circuit 414 generates the phase select signal Sps' for the phase selector 408 according to the adjusted compared result. The phase select signal Sps' controls the phase selector 408 to select one output clock of the output clocks So1'-So8' as the feedback clock Sout', and then the feedback clock Sout' is utilized for controlling the controllable oscillator 406 to generate the output clocks So1'-So8' having the oscillating frequency fo'. Therefore, to control the oscillating frequency fo' of the output clocks So1'-So8' to spread within the predetermined frequency range, i.e., the frequencies between f1 and f2, the spread-spectrum controlling circuit 414 tunes (i.e., the adjusting operation) the compared result to distribute within a specific range to generate the adjusted compared result, wherein the specific range corresponds to the predetermined frequency range. Accordingly, the oscillating frequency fo' of the output clocks So1'-So8' generated by the controllable oscillator 406 can be distributed between the frequencies f1 and f2. Please note that, the present invention is not limited to the above-mentioned frequency spreading method, any other frequency spreading method that is capable of spreading the oscillating frequency fo' of the output clocks So1'-So8' in the frequencies f1 and f2 belongs to the scope of the present invention.

On the other hand, similar to the first embodiment, the phase difference comparator 412 is implemented as a phase accumulating circuit in order to more accurately determine the phase relations between the output clocks So1'-So8' and the data signal Sd' in another embodiment of the present invention. In this embodiment, the phase difference comparator 412 generates a plurality of the compared results at different times respectively, and generates the phase select signal Sps' according to the plurality of compared results. More specifically, when the number of times that the oscillating frequency fo' slower than the data frequency of the data signal Sd' is larger than the number of times that the oscillating frequency fo' faster than the data frequency of the data signal Sd' in the plurality of the compared results, the phase selector 408 selects another output clock having the phase lagging the phase of the first output clock So1' as the feedback clock Sout' from the output clocks So1'-So8', and when the number of times that the oscillating frequency fo' slower than the data frequency of the data signal Sd' is less than the number of times that the oscillating frequency fo' faster than the data frequency of the data signal Sd' in the plurality of the compared results, the phase selector 408 selects another output clock having the phase leading the phase of the first output clock So1' as the feedback clock Sout' from the output clocks So1'-So8'. Please note that, after reading the above-disclosed method, those skilled in this art are readily able to understand the operation of the spread-spectrum controlling circuit 414 in conjunction with the phase accumulating circuit such that the clock data recovery circuit 400 generates the spread-spectrum output clocks So1'-So8' which are accurately synchronized with the data signal Sd'.

Please note that, the above-mentioned embodiments employ a phase selector to select one of the plurality of output clocks as a feedback clock for synthesizing an output clock which is accurately synchronized with a data signal rather than utilize the conventional phase rotator, therefore the above-mentioned embodiments possess a low cost character.

Figure 6:
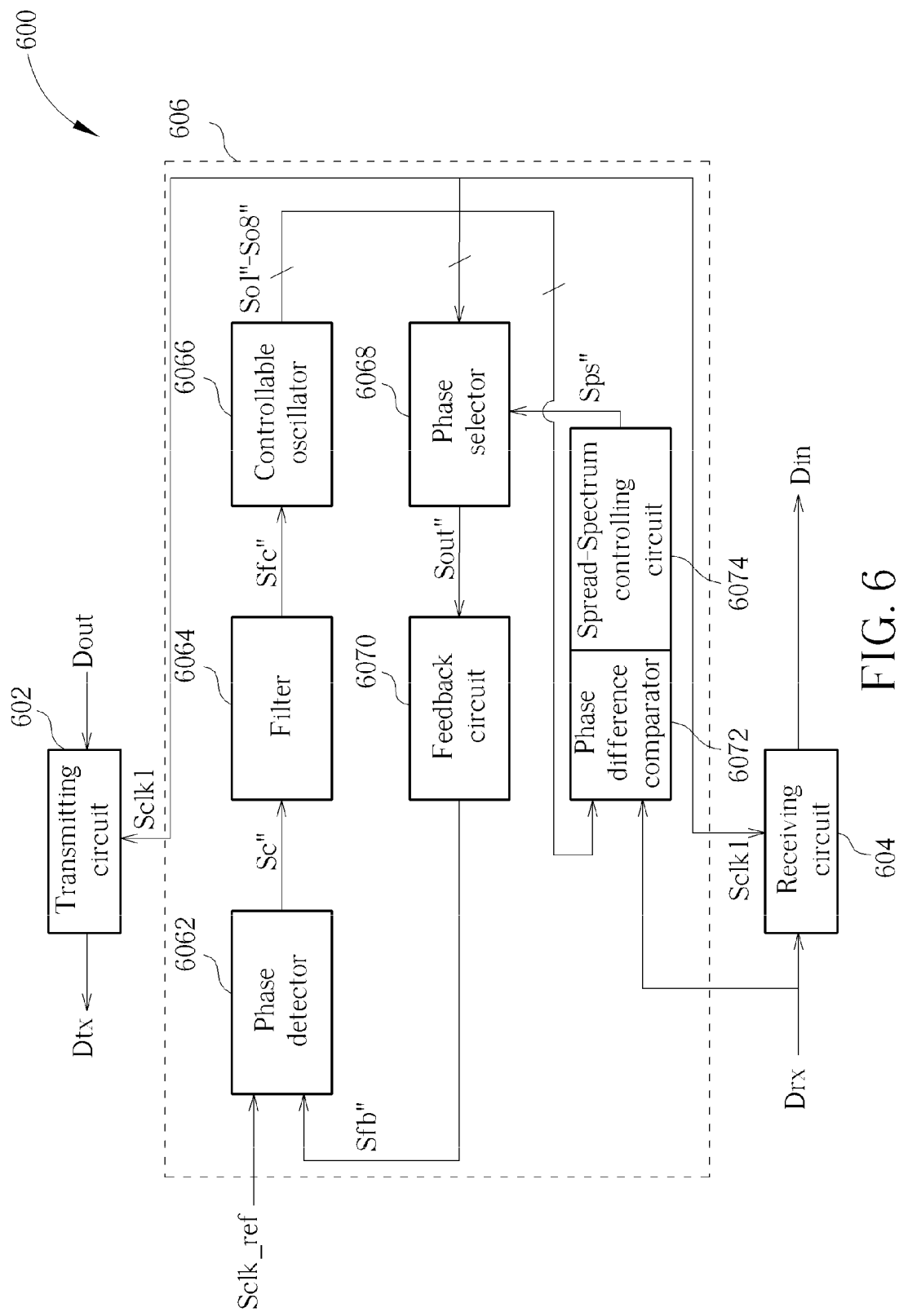
FIG. 6 is a transceiver according to an embodiment of the present invention.

Please refer to FIG. 6. FIG. 6 is a transceiver 600 according to an embodiment of the present invention. The transceiver 600 comprises a transmitting circuit 602, a receiving circuit 604, and a clock generating circuit 606. The transmitting circuit 602 transmits a pre-transmitted data Dout as a transmitted data Dtx according to a first clock signal Sclk1. The receiving circuit 604 receives a pre-received data Drx as a received data Din according to the first clock signal Sclk1. The clock generating circuit 606 is coupled to the transmitting circuit 602 and the receiving circuit 604 for generating the first clock signal Sclk1 according to the pre-received data Drx and a reference clock Sclk_ref.

The clock data recovery circuit 600 comprises a phase detector 6062, a filter 6064, a controllable oscillator 6066, a phase selector 6068, a feedback circuit 6070, a phase difference comparator 6072, and a spread-spectrum controlling circuit 6074. The feedback circuit 6070 is a frequency divider. The phase detector 6062 is utilized for detecting a phase difference between an input clock Sfb" and a reference clock Sclk_ref to generate a control signal Sc" corresponding to the phase difference. The filter 6064 is coupled to the phase detector 6062 for filtering the control signal Sc" to generate a filtered control signal Sfc". The controllable oscillator 6066 is coupled to the filter 6064 for generating a plurality of output clocks So1"-So8" according to the filtered control signal Sfc", wherein the plurality of output clocks So1"-So8" correspond to an oscillating frequency fo" and correspond to a plurality of different phases p1"-p8" respectively. The phase selector 6068 is coupled to the controllable oscillator 6066 for selecting an output clock as a feedback clock Sout" from the plurality of output clocks So1"-So8" according to a phase select signal Sps". The feedback circuit 6070 is coupled to the phase detector 6062 and the phase selector 6068 for generating the input clock Sfb" according to the feedback clock Sout".

Furthermore, the phase difference comparator 6072 is coupled to the controllable oscillator 6066 for comparing the plurality of phases p1"-p8" corresponding to the plurality of output clocks So1"-So8" respectively with a data phase in the data signal Sd" to generate a compared result. The spread-spectrum controlling circuit 6074 is coupled between the phase difference comparator 6072 and the phase selector 6068 for adjusting the compared result, which is generated by the phase difference comparator 6072, inputting to the phase selector 6068. Therefore, a feedback loop configured by the phase detector 6062, the filter 6064, the controllable oscillator 6066, the phase selector 6068, and the feedback circuit 6070 generates a spread-spectrum output clock according to the adjusted compared result. Please note that, the present invention does not limit to the eight output clocks So1"-So8"

and the corresponding eight phases p1"-p8". The first clock signal Sclk1 is selected from one of the plurality of output clocks So1"-So8". For example, the first clock signal Sclk1 is the first output clock So1" in this embodiment.

In addition, in this embodiment, the clock generating circuit 606 of the transceiver 600 is similar with the clock generating circuit 400 shown in FIG. 4, thus the detailed description related to the clock generating circuit 606 is omitted here for brevity. When the transceiver 600 is activated, the receiving circuit 604 receives the pre-received data Drx transmitted from another transceiver. Meanwhile, the clock generating circuit 606 generates the first clock signal Sclk1 synchronized with the received data Drx according to the pre-received data Drx and the reference clock Sclk_ref. Therefore, when the pre-received data Drx transmitted from another transceiver is a spread-spectrum data, the clock generating circuit 606 has to generate the first clock signal Sclk1 with the spread-spectrum characteristic to effectively lock (i.e., synchronize) the pre-received data Drx. At the same time, the spread-spectrum controlling circuit 6074 of the clock generating circuit 606 follows the pre-received data Drx to fine tune the compared result generated by the phase difference comparator 6072. More specifically, as the phase select signal Sps" is generated according to the pre-received data Drx with the spread-spectrum characteristic, the first clock signal Sclk1 generated by the controllable oscillator 6066 also possesses the characteristic of spectrum spreading as well as the pre-received data Drx. In other words, the spread-spectrum controlling circuit 6074 in the clock generating circuit 606 is a spread-spectrum clock follower controlling circuit.

On the other hand, when the pre-received data transmitted from another transceiver is not a spread-spectrum data, the clock generating circuit 606 generates a spread-spectrum first clock signal Sclk1 for the transmitting circuit 602 to transmit the pre-transmitted data Dout to the transceiver (i.e., transmit a spread-spectrum data to the transceiver) to test if the transmitter is a spread-spectrum transmitter. Then, if the transceiver 600 receives a spread-spectrum pre-received data Drx, the transmitter 600 ascertains that the transceiver transmitting the pre-received data Drx is the spread-spectrum transmitter, i.e., the transceiver is capable of generating a spread-spectrum data (i.e., the pre-received data Drx) according to the transmitted data Dtx. On the other hand, if the transceiver 600 still receives a non-spread-spectrum pre-received data Drx, the transmitter 600 ascertains that the transceiver transmitting the pre-received data Drx is the non-spread-spectrum transmitter, i.e., the transceiver is unable to generate a spread-spectrum data (i.e., the pre-received data Drx) according to the transmitted data Dtx. Then, the clock generating circuit 606 generates a non-spread-spectrum first clock signal Sclk1 to the receiving circuit 604 for locking (i.e., synchronizing) the pre-received data Drx. In other words, when the pre-received data Drx received by the transceiver 600 is not a spread-spectrum data, the spread-spectrum controlling circuit 6074 of the clock generating circuit 606 follows the pre-received data Drx but does not fine tune the compared result generated by the phase difference comparator 6072. Accordingly, the first clock signal Sclk1 generated by the controllable oscillator 6066 is not a spread-spectrum clock signal such that the first clock signal Sclk1 can be utilized to synchronize the pre-received data Drx.

Briefly, when the transmitting circuit 602 of the transceiver 600 utilizes the first clock signal Sclk1 to transmit the pre-transmitted data Dout to another transceiver, which is capable of receiving a spread-spectrum data, the spread-spectrum controlling circuit 6074 of the clock generating circuit 606 fine tunes the compared result generated by the phase difference comparator 6072 such that the controllable oscillator 6066 generates the spread-spectrum first clock signal Sclk1. In other words, the spread-spectrum controlling circuit 6074 is a spread-spectrum clock generation controlling circuit. Similarly, when the transceiver transmitting the pre-received data Drx is unable to receive a spread-spectrum data, the spread-spectrum controlling circuit 6074 of the clock generating circuit 606 does not fine tune the compared result generated by the phase difference comparator 6072 such that the controllable oscillator 6066 generates the non-spread-spectrum first clock signal Sclk1. Please note that, in another embodiment of the present invention, the phase difference comparator 6072 may be implemented as a phase accumulating circuit in order to more accurately determine the phase relations between the output clocks So1"-So8" and the pre-received data Drx, and since the reason has been disclosed in the above-mentioned embodiments, the detailed description is omitted here for brevity.

Briefly, the present invention employs a phase selector to select one of the plurality of output clocks as the feedback clock for synthesizing an output clock which is accurately synchronized with a data signal, and therefore saves the cost of a clock data recovery circuit. Furthermore, by utilizing the above-mentioned clock data recovery circuit, only one clock data recovery circuit is employed in another embodiment of the present invention for transmitting a pre-transmitted data and receiving a pre-received data that further reduces the cost of a transceiver since the conventional transceiver utilizes two clock data recovery circuits for transmitting the pre-transmitted data and receiving the pre-received data respectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock generating circuit, comprising:
   a phase detector, for detecting a phase difference between an input clock and a reference clock to generate a control signal corresponding to the phase difference;
   a controllable oscillator, for generating a plurality of output clocks according to the control signal, wherein the plurality of output clocks correspond to an oscillating frequency and correspond to a plurality of different phases respectively;
   a phase selector, coupled to the controllable oscillator, for selecting an output clock as a feedback clock from the plurality of output clocks according to a phase select signal;
   a feedback circuit, coupled to the phase detector and the phase selector, for generating the input clock according to the feedback clock; and
   a phase difference comparator, coupled to the controllable oscillator and the phase selector, for comparing the plurality of phases corresponding to the plurality of output clocks respectively with a data phase of a data signal to generate a compared result, and generating the phase select signal according to the compared result.

2. The clock generating circuit of claim 1, wherein when the compared result indicates the oscillating frequency is slower than a data frequency of the data signal, the phase selector selects another output clock having a phase lagging the phase of the output clock as the feedback clock from the plurality of output clocks, and when the compared result indicates the oscillating frequency is faster than the data frequency of the data signal, the phase selector selects another output clock having the phase leading the phase of the output clock as the feedback clock from the plurality of output clocks.

3. The clock generating circuit of claim 1, wherein the phase difference comparator further generates a plurality of the compared results at different times respectively, and generates the phase select signal according to the plurality of compared results.

4. The clock generating circuit of claim 3, wherein, in the plurality of the compared results, when a number of times that the oscillating frequency slower than the data frequency of the data signal is larger than a number of times that the oscillating frequency faster than the data frequency of the data signal, the phase selector selects another output clock having the phase lagging the phase of the output clock as the feedback clock from the plurality of output clocks, and, in the plurality of the compared results, when the number of times that the oscillating frequency slower than the data frequency of the data signal is less than the number of times that the oscillating frequency faster than the data frequency of the data signal, the phase selector selects another output clock having the phase leading the phase of the output clock as the feedback clock from the plurality of output clocks.

5. The clock generating circuit of claim 1, further comprising:
a spread-spectrum controlling circuit, coupled between the phase difference comparator and the phase selector, for adjusting the compared result generated by the phase difference comparator such that a frequency of the output clock spreads over a specific frequency range.

6. The clock generating circuit of claim 1, further comprising a clock data recovery circuit for recovering a data clock in the data signal.

7. A clock generating method, comprising:
detecting a phase difference between an input clock and a reference clock to generate a control signal corresponding to the phase difference;
generating a plurality of output clocks according to the control signal, wherein the plurality of output clocks correspond to an oscillating frequency and correspond to a plurality of different phases respectively;
selecting an output clock as a feedback clock from the plurality of output clocks according to a phase select signal;
generating the input clock according to the feedback clock; and
comparing the plurality of phases corresponding to the plurality of output clocks respectively with a data phase of a data signal to generate a compared result, and generating the phase select signal according to the compared result.

8. The clock generating method of claim 7, wherein when the compared result indicates the oscillating frequency is slower than a data frequency of the data signal, selecting another output clock having a phase lagging the phase of the output clock as the feedback clock from the plurality of output clocks, and when the compared result indicates the oscillating frequency is faster than the data frequency of the data signal, selecting another output clock having the phase leading the phase of the output clock as the feedback clock from the plurality of output clocks.

9. The clock generating method of claim 7, wherein the step of comparing the plurality of phases corresponding to the plurality of output clocks respectively with the data phase of the data signal comprises:
generating a plurality of the compared results at different times respectively, and generating the phase select signal according to the plurality of compared results.

10. The clock generating method of claim 9, wherein when a number of times that the oscillating frequency slower than the data frequency of the data signal is larger than a number of times that the oscillating frequency faster than the data frequency of the data signal in the plurality of the compared results, selecting another output clock having the phase lagging the phase of the output clock as the feedback clock from the plurality of output clocks, and when the number of times that the oscillating frequency slower than the data frequency of the data signal is less than the number of times that the oscillating frequency faster than the data frequency of the data signal in the plurality of the compared results, selecting another output clock having the phase leading the phase of the output clock as the feedback clock from the plurality of output clocks.

11. The clock generating method of claim 7, further comprising:
adjusting the compared result such that a frequency of the output clock spreads over a specific frequency range.

12. The clock generating method of claim 7, comprising a clock data recovery method for recovering a data clock in the data signal.

13. The clock generating method of claim 7, further comprising:
transmitting a pre-transmitted data according to a first clock signal; and
receiving a pre-received data according to the first clock signal;
wherein when the pre-received data is not a spread-spectrum data, generating a spread-spectrum first clock signal to spectrum-spread the pre-transmitted data to thereby test if a transmitter that transmitted the pre-received data is a spread-spectrum transmitter, if the transmitter is the spread-spectrum transmitter, continue generating the spread-spectrum first clock signal, if the transmitter is not the spread-spectrum transmitter, generating a non-spread-spectrum first clock signal.

* * * * *